United States Patent
Hwang et al.

(10) Patent No.: US 10,204,550 B2
(45) Date of Patent: Feb. 12, 2019

(54) SENSING CIRCUIT AND CORRESPONDING OLED DISPLAY DEVICE

(71) Applicant: SHENZHEN CHINA STAR OPTOELECTRONICS TECHNOLOGY CO., LTD., Shenzhen (CN)

(72) Inventors: Taijiun Hwang, Shenzhen (CN); Pengfei Liang, Shenzhen (CN)

(73) Assignee: Shenzhen China Star Optoelectronics Technology Co., Ltd. (CN)

( * ) Notice: Subject to any disclaimer, the term of this patent is extended or adjusted under 35 U.S.C. 154(b) by 19 days.

(21) Appl. No.: 14/905,886

(22) PCT Filed: Dec. 28, 2015

(86) PCT No.: PCT/CN2015/099243
§ 371 (c)(1),
(2) Date: Jan. 18, 2016

(87) PCT Pub. No.: WO2017/088243
PCT Pub. Date: Jun. 1, 2017

(65) Prior Publication Data
US 2018/0254006 A1 Sep. 6, 2018

(30) Foreign Application Priority Data

Nov. 24, 2015 (CN) .......................... 2015 1 0827113

(51) Int. Cl.
*G09G 3/3233* (2016.01)
*H01L 27/32* (2006.01)
*G09G 3/3258* (2016.01)
*H01L 27/12* (2006.01)

(52) U.S. Cl.
CPC ......... *G09G 3/3233* (2013.01); *G09G 3/3258* (2013.01); *H01L 27/124* (2013.01); *H01L 27/3276* (2013.01)

(58) Field of Classification Search
CPC .. G09G 3/3233; G09G 3/3258; G09G 3/3291; H01L 27/124; H01L 27/3276
See application file for complete search history.

(56) References Cited

U.S. PATENT DOCUMENTS

| | | | |
|---|---|---|---|
| 9,799,246 B2* | 10/2017 | Chaji | G09G 3/3233 |
| 2012/0169704 A1* | 7/2012 | Chung | G09G 3/3233 345/212 |
| 2015/0061981 A1* | 3/2015 | Lee | G09G 3/3291 345/77 |
| 2015/0187278 A1* | 7/2015 | Park | G09G 3/3291 345/212 |
| 2015/0379909 A1* | 12/2015 | Yu | G09G 3/006 345/690 |

(Continued)

*Primary Examiner* — Sardis F Azongha
(74) *Attorney, Agent, or Firm* — Emerson, Thomson & Bennett, LLC; Roger D. Emerson (57) ABSTRACT

A sensing circuit for sensing a micro current and voltage of a device to be tested is disclosed. The sensing circuit includes a pixel circuit and a sensing circuit. The sensing circuit is connected to the pixel circuit via a sensing line. The sensing circuit includes an amplifier, a first capacitor, a first switch, a second switch, a third switch, a fourth switch, a correlated double sampling (CDS) circuit, and an analog-to-digital converter (ADC).

15 Claims, 9 Drawing Sheets

(56) References Cited

U.S. PATENT DOCUMENTS

| | | | |
|---|---|---|---|
| 2015/0379937 A1* | 12/2015 | Kim | G09G 3/006 345/691 |
| 2016/0012798 A1* | 1/2016 | Oh | G09G 3/325 345/205 |
| 2016/0078805 A1* | 3/2016 | Woo | G09G 3/3225 345/78 |
| 2016/0155380 A1* | 6/2016 | Kwon | G09G 3/3233 345/78 |
| 2016/0155381 A1* | 6/2016 | Kwon | G09G 3/3233 345/215 |

* cited by examiner

SENSING CIRCUIT AND CORRESPONDING OLED DISPLAY DEVICE

BACKGROUND OF THE INVENTION

1. Field of the Invention

The present invention generally relates to a sensing circuit for sensing a micro current and voltage of a device to be tested, and more particularly to a liquid crystal display device.

2. Description of Prior Art

A display method of OLED display technology is different from that of conventional LCD display technology. In an OLED display device, a backlight is not required. The OLED display device utilizes an ultrathin organic material coating layer and a glass substrate, and organic material emits light by when a current flows. A screen of the OLED display device is usually thinner, and it has a larger viewing angle and consumes less power.

Figure 1:
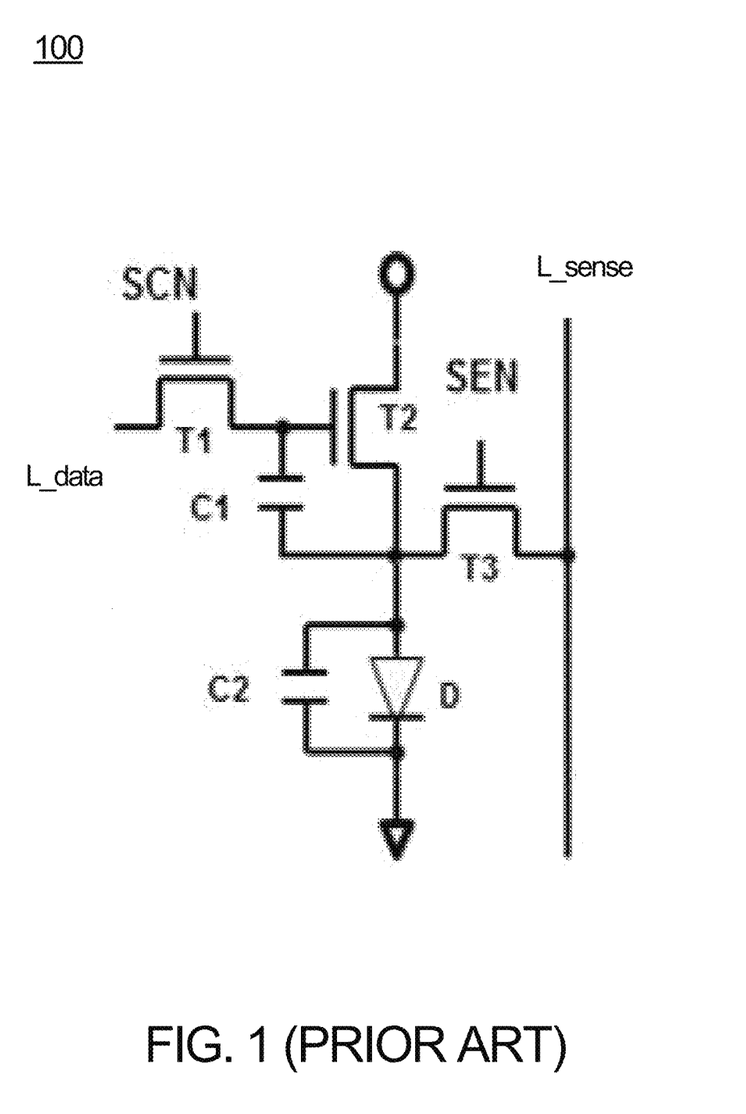
FIG. 1 shows a pixel circuit in a conventional OLED panel.

FIG. 1 shows a pixel circuit in a conventional OLED panel. The pixel circuit comprises a data line for inputting data; a first thin film transistor and a second thin film transistor, a gate of the second thin film transistor connected to a drain of the first thin film transistor; a second capacitor connected to the gate a drain of the second thin film transistor; an organic light-emitting diode connected to the drain of the second thin film transistor; and a third capacitor connected to two terminals of the organic light-emitting diode. A scan signal is inputted to a gate of the first thin film transistor.

Figure 2:
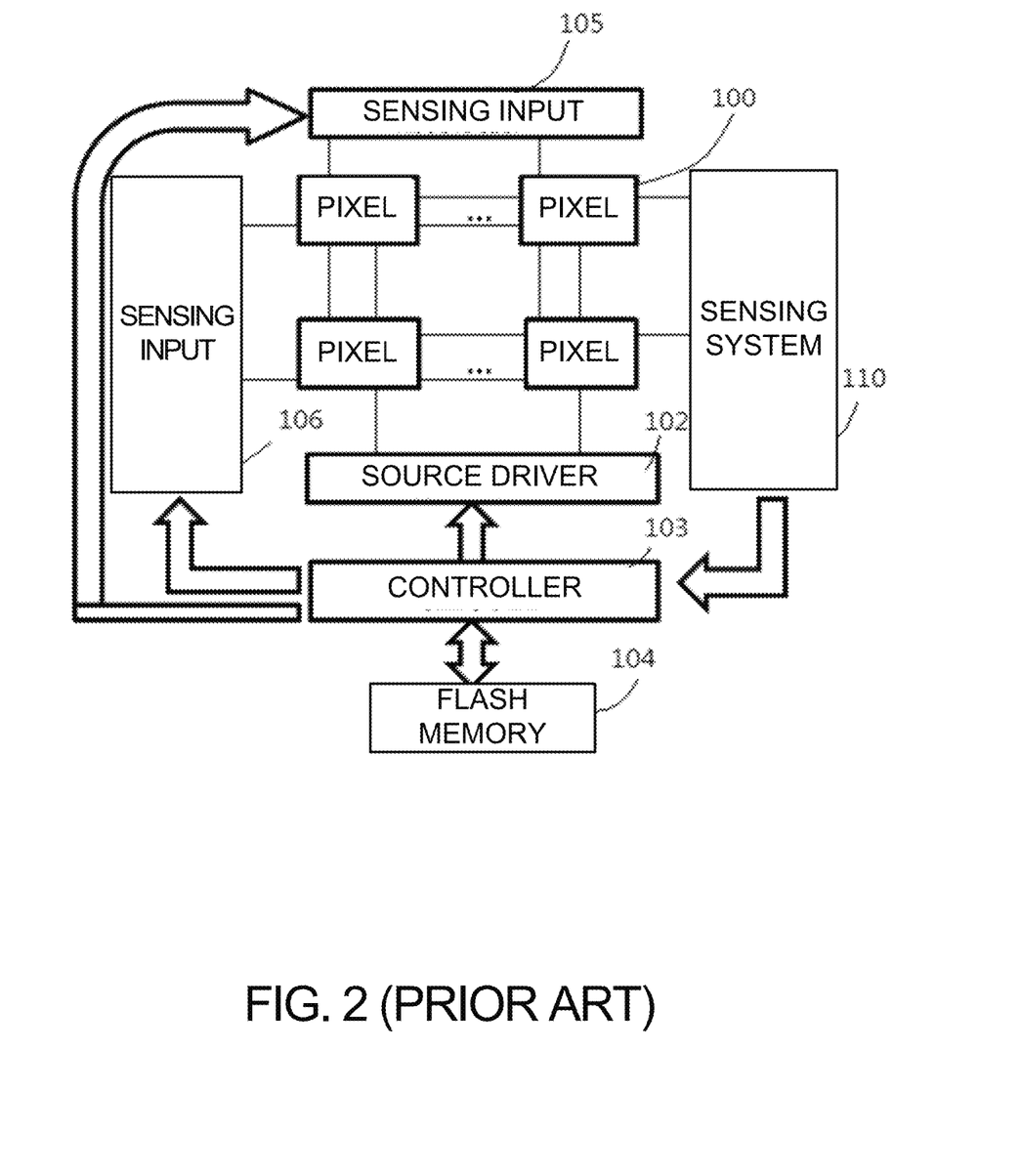
FIG. 2 shows a block diagram of a conventional sensing circuit.

FIG. 2 shows a block diagram of a conventional sensing circuit. The sensing circuit comprises the pixel circuit 100, a sensing system 110, a source driver 102, a controller 103, a flash memory 104, a sensing input 105, and a scan input 106.

Since the thin film transistors and the OLED panel are aging, a turn-on voltage of a thin film transistor has a voltage offset Vth_TFT and an OLED has a voltage offset Vth_oled. Accordingly, the display quality is not uniform.

To solve the above-mentioned problem that the display quality is not uniform, as shown in FIG. 2, the characteristics of the second thin film transistor T2 and the OLED in the pixel circuits are sensed by sensing lines, and then the external controller compensates the voltage offsets, so that an image can acquire uniform display effect.

SUMMARY OF THE INVENTION

An objective of the present invention is to provide a sensing circuit and a corresponding OLED display device. The sensing circuit is utilized for sensing a micro current and voltage of a device to be tested. In a current sensing mode, the sensing circuit supports a double sense to eliminate effect of noise and a leakage current.

In accordance with an embodiment of the present invention, the OLED display device comprises: a pixel circuit comprising: a data line for inputting data; a first thin film transistor; a second thin film transistor, a gate of the second thin film transistor connected to a drain of the first thin film transistor; a third thin film transistor, a source of the third thin film transistor connected to a drain of the second thin film transistor; a second capacitor connected the gate and a drain of the second thin film transistor; an organic light-emitting diode connected to the drain of the second thin film transistor; and a third capacitor connected to two terminals of the organic light-emitting diode.

The sensing circuit for sensing the micro current and voltage of the device to be tested in accordance with the present invention comprises: an amplifier having a first input terminal, a second input terminal, and an output terminal; a first capacitor connected between the first input terminal and the output terminal of the amplifier; a first switch connected to the first capacitor in parallel; a second switch connected between the first input terminal of the amplifier and the device to be tested; a third switch connected between the second input terminal of the amplifier and the device to be tested; a fourth switch connected between the second input terminal of the amplifier and a constant voltage source; a correlated double sampling (CDS) circuit connected to the output terminal of the amplifier; and an analog-to-digital converter (ADC) connected to the correlated double sampling circuit.

The correlated double sampling circuit is utilized for storing a value of a voltage outputted by the amplifier.

The analog-to-digital converter is utilized for digitizing a voltage value outputted by the correlated double sampling circuit and then outputting a digitized value.

In accordance with an embodiment of the present invention, when the fourth switch and the second switch are turned on and the third switch is turned off, the amplifier is utilized as an integrator. The integrator performs an integration operation to a current and clamps a voltage of the second thin film transistor via an input voltage of the second input terminal to generate an output voltage to the correlated double sampling circuit.

In accordance with an embodiment of the present invention, when the first switch and the third switch are turned on and the second switch is turned off, the amplifier is utilized as a buffer. The buffer clamps a voltage of the second thin film transistor via an input voltage of the second input terminal to generate an output voltage to the correlated double sampling circuit.

In the present invention, the results from the current sense and the voltage sense have different methods to calculate compensation values. The present invention supports the two methods and has different processes for different states. Since the manufacturing processes are different, the characteristic parameters from the current sense and the voltage sense reflecting the thin film transistor and the OLED are different. The circuit of the present invention can support the two methods and adjust correspondingly.

For a better understanding of the aforementioned content of the present invention, preferable embodiments are illustrated in accordance with the attached figures for further explanation.

DETAILED DESCRIPTION OF THE INVENTION

The following embodiments are referring to the accompanying drawings for exemplifying specific implementable embodiments of the present invention.

Figure 3:
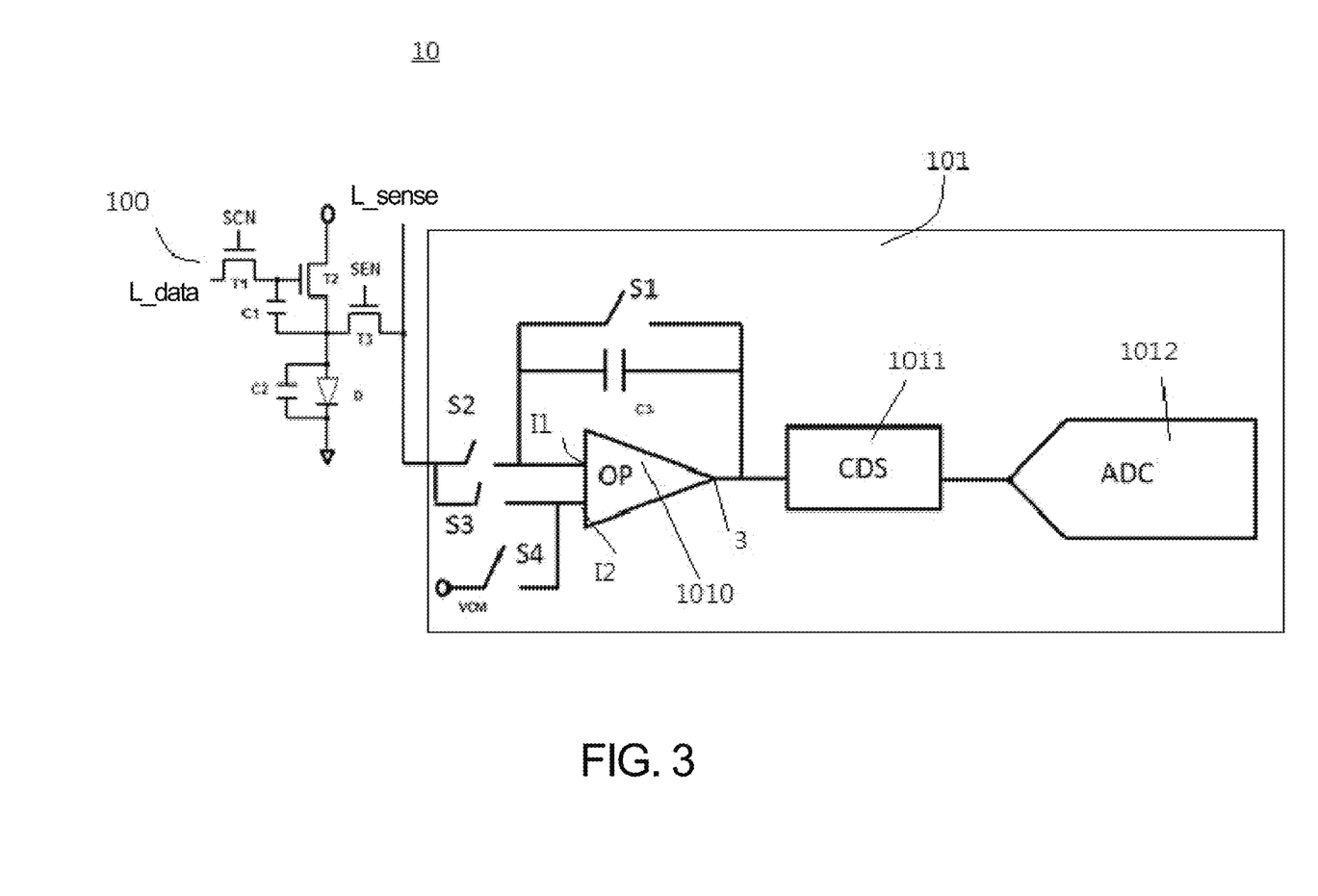
FIG. 3 shows a sensing circuit in accordance with an embodiment of the present invention.

Please refer to FIG. 3. FIG. 3 shows a sensing circuit 10 in accordance with an embodiment of the present invention. The sensing circuit 10 comprises a data line L_data for inputting data; a first thin film transistor T1; a second thin film transistor T2, a gate of the second thin film transistor T2 connected to a drain of the first thin film transistor T1; a third thin film transistor T3, a source of the third thin film transistor T3 connected to a drain of the second thin film transistor T2; a second capacitor C1 connected the gate and a drain of the second thin film transistor T2; an organic light-emitting diode D connected to the drain of the second thin film transistor T2; a third capacitor C2 connected to two terminals of the organic light-emitting diode D; and a sensing line L_sense connected to a drain of the third thin film transistor T3. A scan signal SCN is inputted to a gate of the first thin film transistor T1. A sensing signal SEN is inputted to a gate of the third thin film transistor T3.

A feature of the sensing circuit for sensing a micro current and voltage in accordance with the present invention is to comprise a sensing circuit 101 connected to the pixel circuit 100 via the sensing line L_sense. The sensing circuit 101 comprises an amplifier 1010 having a first input terminal 11, a second input terminal 12, and an output terminal 3; a first capacitor C3 connected to the first input terminal 11 and the output terminal 3 of the amplifier 1010; a first switch S1 connected to two terminals of the first capacitor C3; a second switch S2 connected to the first capacitor C3 and the first switch S1 at the first input terminal 11 of the amplifier 1010; a third switch S3 connected to the second input terminal 12 of the amplifier 1010 and the second switch S2; a fourth switch S4 connected to the second input terminal 12 of the amplifier 1010 and the third switch S3; a correlated double sampling (CDS) circuit 1011 connected to the output terminal 3 of the amplifier 1010; and an analog-to-digital converter (ADC) 1012 connected to the correlated double sampling circuit 1011.

When the fourth switch S4 is turned on, the second switch S2 is turned on, and the third switch S3 is turned off, the amplifier 1010 becomes an integrator capable of performing an integration operation to a current I flowing through the second thin film transistor T2 and the organic light-emitting diode D. Then, the analog-to-digital converter 1012 samples to acquire characteristic parameters of the second thin film transistor T2 and the organic light-emitting diode D. When the second switch S2 is turned off, the third switch S3 is turned on, and the first switch S1 is turned on, the amplifier 1010 becomes a buffer. The analog-to-digital converter 1012 samples the voltage of the second thin film transistor T2 to acquire the characteristic parameters of the second thin film transistor T2 and the organic light-emitting diode D.

Figure 4:
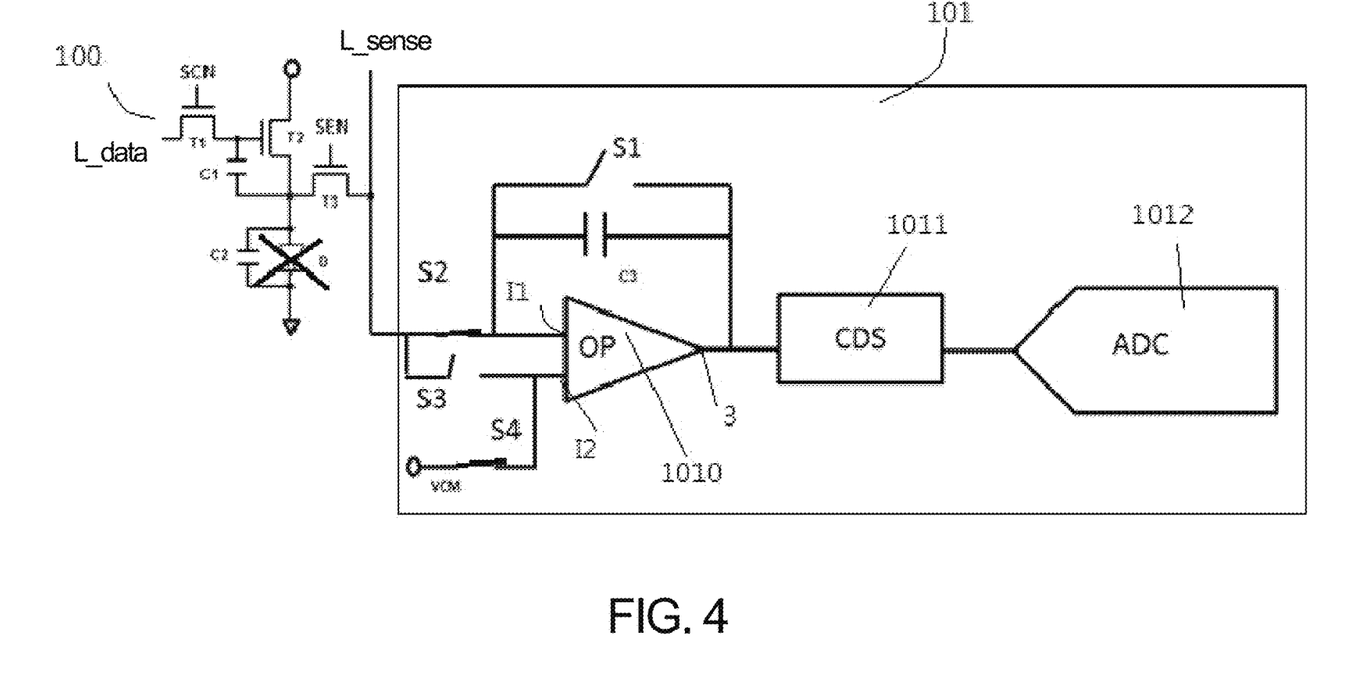
FIG. 4 shows the sensing circuit in a first mode for sensing the current flowing through the second thin film transistor in accordance with the embodiment of the present invention.

Please refer to FIG. 4. FIG. 4 shows the sensing circuit in a first mode for sensing the current flowing through the second thin film transistor T2 in accordance with the embodiment of the present invention. The amplifier 1010 becomes an integrator which can be initialized by turning on the first switch S1. When the first switch S1 is turned on, the integrator starts to integrate. The first thin film transistor T1 and the second thin film transistor T2 are turned on, and no current flows through the organic light-emitting diode D which is marked with 'X'. The data line L_data outputs a voltage Vdata to turn on the second thin film transistor T2. A value of a constant voltage source VCM is smaller than a value of the voltage Vdata, and thus the organic light-emitting diode D is in a turn-off state. The integrated voltage is stored to the correlated double sampling circuit 1011, and the analog-to-digital converter 1012 samples the voltage of the second thin film transistor T2. The sampled voltage $\Delta V$ is acquired from the following equation:

$$\Delta V = \Delta t * I / C3.$$

$\Delta t$ is an integration time, and I is a current flowing through the second thin film transistor T2.

Figure 5:
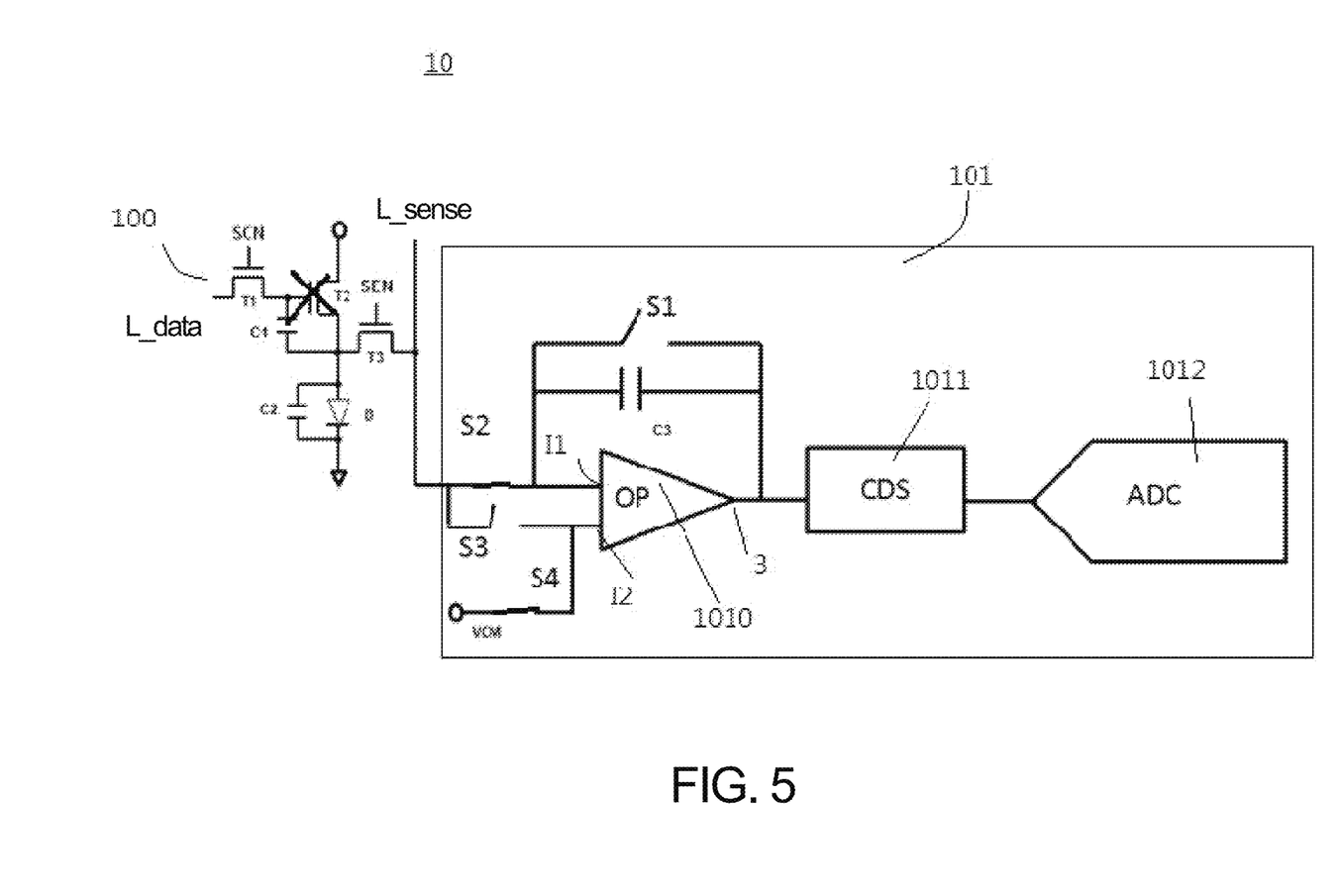
FIG. 5 shows the sensing circuit in a second mode for sensing the current flowing through the organic light-emitting diode in accordance with the embodiment of the present invention.

Please refer to FIG. 5. FIG. 5 shows the sensing circuit in a second mode for sensing the current flowing through the organic light-emitting diode D in accordance with the embodiment of the present invention. The amplifier 1010 becomes an integrator which can be initialized by turning on the first switch S1. When the first switch S1 is turned on, the integrator starts to integrate. The first thin film transistor T1 is turned on, and the second thin film transistor T2 is turned off which is marked with 'X'. The data line L_data outputs a voltage Vdata to turn off the second thin film transistor T2. The value of the constant voltage source VCM is larger than the value of the voltage Vdata, and thus the organic light-emitting diode D is in a turn-on state. The integrated voltage is stored to the correlated double sampling circuit 1011, and the analog-to-digital converter 1012 samples the voltage of the second thin film transistor T2. The sampled voltage $\Delta V$ is acquired from the following equation:

$$\Delta V = \Delta t * I / C3.$$

$\Delta t$ is an integration time, and I is a current flowing through the second thin film transistor T2.

Figure 6A:
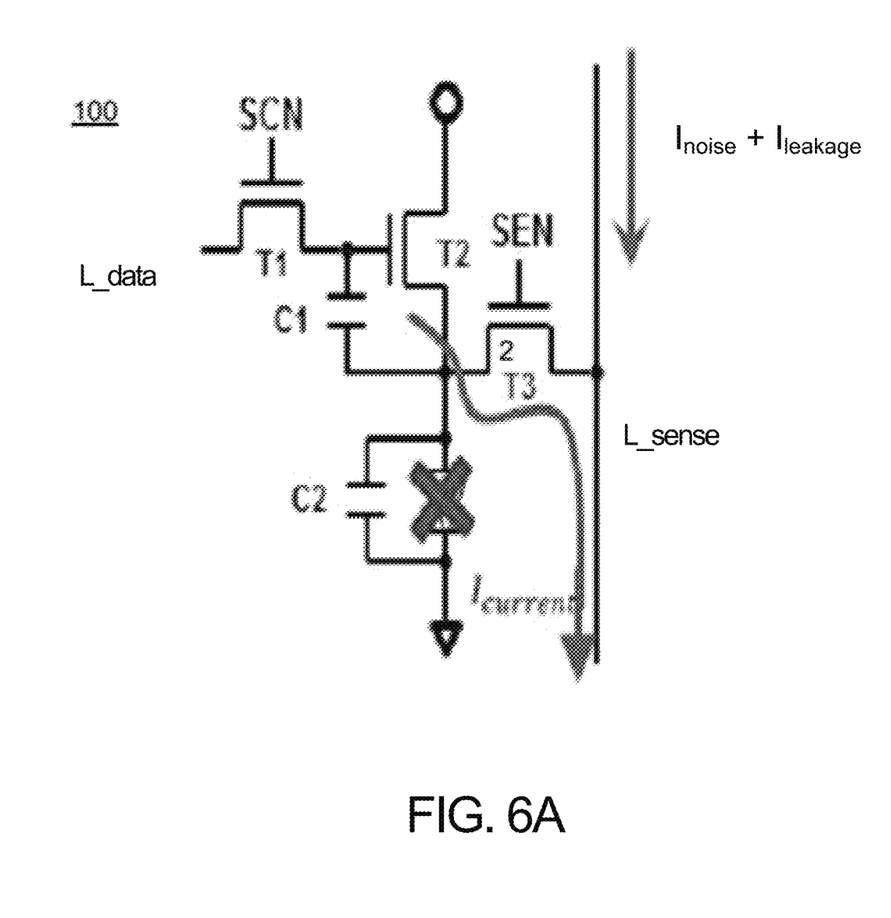
FIGS. 6A-6B show the pixel circuit in accordance with the embodiment of the present invention.
Figure 6B:
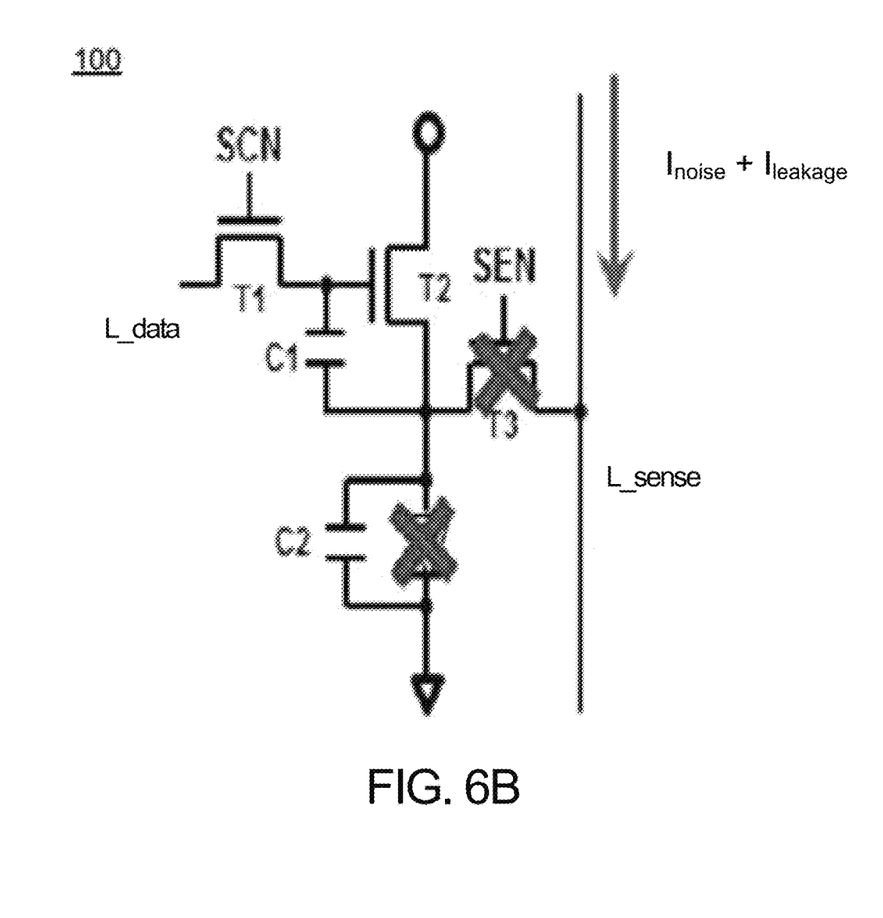

Please refer to FIGS. 6A-6B. FIGS. 6A-6B show the pixel circuit for eliminating a noise current $I_{noise}$ and a leakage current $I_{leakage}$ in accordance with the embodiment of the present invention. As shown in FIG. 4 and FIG. 5, the amplifier 1010 becomes an integrator which can be initialized by turning on the first switch S1. As shown in FIG. 6A, the current is $I_{current} + I_{noise} + I_{leakage}$. No current flows through the organic light-emitting diode D which is marked with 'X'. $I_{current}$ is current I in FIG. 4 which is stored in the correlated double sampling circuit 1011. The sensing signal SEN is inputted to turn off the third thin film transistor T3 which is marked with 'X'. Then, the acquired current is $I_{noise} + I_{leakage}$ and stored in the correlated double sampling circuit 1011. The value of $I_{current}$ can be acquired N by storing two times. That is, it represents that the noise current $I_{noise}$ and the leakage current $I_{leakage}$ are eliminated.

Figure 7:
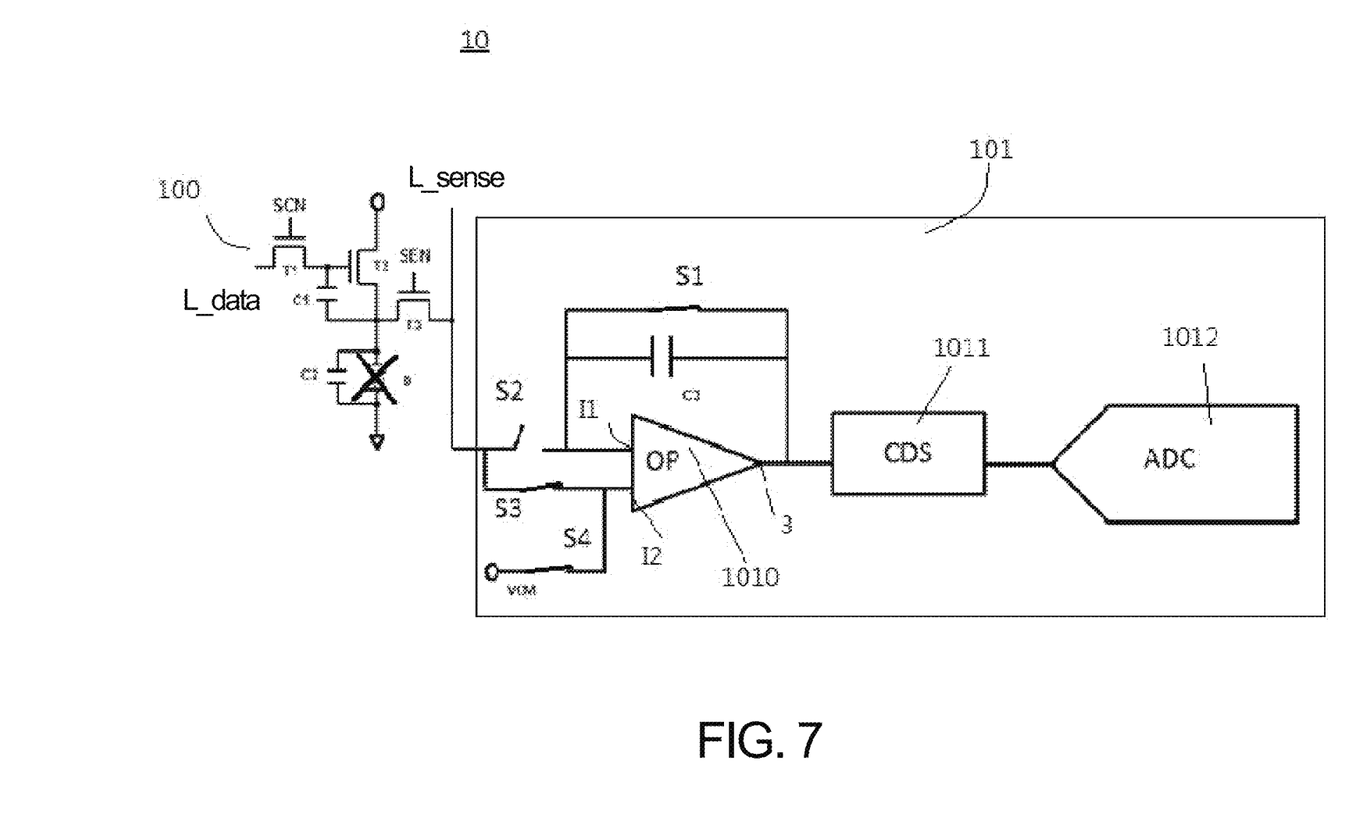
FIG. 7 shows the sensing circuit in a third mode for sensing a source voltage of the second thin film transistor in accordance with the embodiment of the present invention.

Please refer to FIG. 7. FIG. 7 shows the sensing circuit in a third mode for sensing a source voltage of the second thin film transistor T2 in accordance with the embodiment of the present invention. The amplifier 1010 becomes a buffer. The first thin film transistor T1 and the third thin film transistor T3 corresponding to the scan signal SCN and the sensing signal SEN are turned on. No current flows through the organic light-emitting diode D which is remarked with 'X'. The data line L_data outputs a voltage Vdata to turn on the second thin film transistor T2. Since Vdata is smaller and the voltage value of the constant voltage source VCM is smaller than (Vdata-Vth_TFT), the organic light-emitting diode D is in a turn-off state. Vth_TFT is an offset of the turn-on voltage of the thin film transistor. The fourth switch S4 is turned off. Since a voltage clamp of the constant voltage source VCM does not exist, the voltage of the source of the second thin film transistor T2 is changed. After a stable time, the analog-to-digital converter 1012 directly samples the voltage of the source of the second thin film transistor T2 to acquire the characteristic parameter of the second thin film transistor T2.

Figure 8:
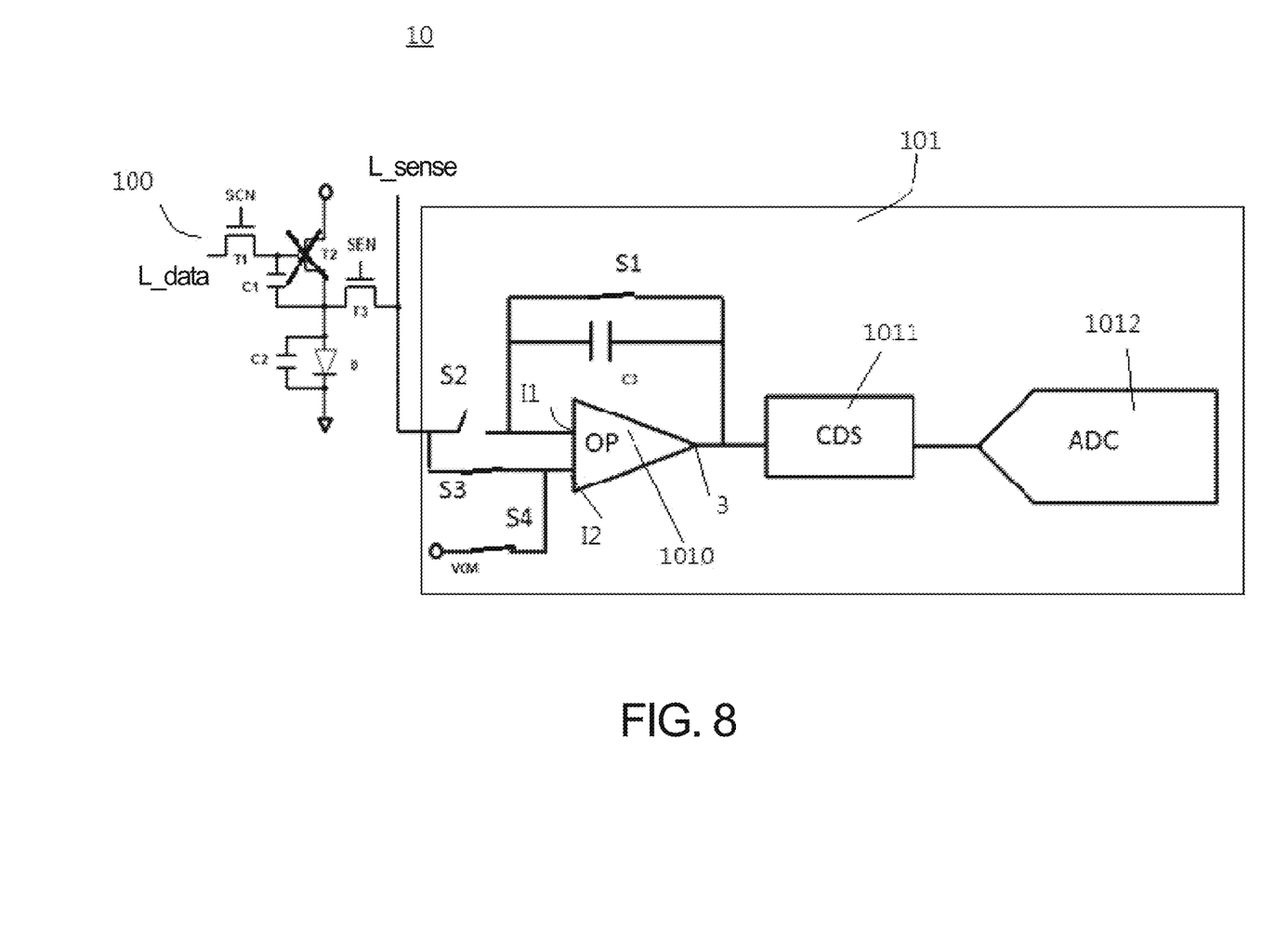
FIG. 8 shows the sensing circuit in a fourth mode for sensing a voltage of the organic light-emitting diode D in accordance with the embodiment of the present invention.

Please refer to FIG. 8. FIG. 8 shows the sensing circuit in a fourth mode for sensing a voltage of the organic light-emitting diode D in accordance with the embodiment of the present invention. The amplifier 1010 becomes a buffer. The first thin film transistor T1 and the third thin film transistor T3 corresponding to the scan signal SCN and the sensing signal SEN are turned on. The data line L_data outputs a voltage Vdata to turn off the second thin film transistor T2 which is remarked with 'X'. Since the voltage value of the constant voltage source VCM is larger than Vdata and larger than Vth_OLED, the organic light-emitting diode D is in a turn-on state. Vth_OLED is a voltage offset of the organic light-emitting diode D. The fourth switch S4 is turned off. Since the voltage clamp of the constant voltage source VCM does not exist, the voltage of the source of the second thin film transistor T2 is changed. After a stable time, the analog-to-digital converter 1012 directly samples the voltage of the source of the second thin film transistor T2 to acquire the characteristic parameter of the organic light-emitting diode D.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structures.

What is claimed is:

1. A sensing circuit for sensing a micro current and voltage of a device to be tested, the sensing circuit comprising:
   an amplifier having a first input terminal, a second input terminal, and an output terminal;
   a first capacitor connected between the first input terminal and the output terminal of the amplifier;
   a first switch connected to the first capacitor in parallel;
   a second switch connected between the first input terminal of the amplifier and the device to be tested;
   a third switch connected between the second input terminal of the amplifier and the device to be tested;
   a fourth switch connected between the second input terminal of the amplifier and a constant voltage source;
   a correlated double sampling (CDS) circuit connected to the output terminal of the amplifier; and
   an analog-to-digital converter (ADC) connected to the correlated double sampling circuit,
   wherein the correlated double sampling circuit is utilized for storing a value of a voltage outputted by the amplifier.

2. A sensing circuit for sensing a micro current and voltage of a device to be tested, the sensing circuit comprising:
   an amplifier having a first input terminal, a second input terminal, and an output terminal;
   a first capacitor connected between the first input terminal and the output terminal of the amplifier;
   a first switch connected to the first capacitor in parallel;
   a second switch connected between the first input terminal of the amplifier and the device to be tested;
   a third switch connected between the second input terminal of the amplifier and the device to be tested;
   a fourth switch connected between the second input terminal of the amplifier and a constant voltage source;
   a correlated double sampling (CDS) circuit connected to the output terminal of the amplifier; and
   an analog-to-digital converter (ADC) connected to the correlated double sampling circuit.

3. The sensing circuit for sensing the micro current and voltage of the device to be tested of claim 2, wherein when the fourth switch and the second switch are turned on and the third switch is turned off, the amplifier is utilized as an integrator.

4. The sensing circuit for sensing the micro current and voltage of the device to be tested of claim 3, wherein the integrator performs an integration operation to a current and clamps a voltage of the second thin film transistor via an input voltage of the second input terminal to generate an output voltage to the correlated double sampling circuit.

5. The sensing circuit for sensing the micro current and voltage of the device to be tested of claim 2, wherein when the first switch and the third switch are turned on and the second switch is turned off, the amplifier is utilized as a buffer.

6. The sensing circuit for sensing the micro current and voltage of the device to be tested of claim 5, wherein the buffer clamps a voltage of the second thin film transistor via an input voltage of the second input terminal to generate an output voltage to the correlated double sampling circuit.

7. The sensing circuit for sensing the micro current and voltage of the device to be tested of claim 2, wherein the correlated double sampling circuit is utilized for storing a value of a voltage outputted by the amplifier and performing a logical operation to generate a voltage value.

8. The sensing circuit for sensing the micro current and voltage of the device to be tested of claim 2, wherein the analog-to-digital converter is utilized for digitizing a voltage value outputted by the correlated double sampling circuit and then outputting a digitized value.

9. An OLED display device, comprising:
   a pixel circuit comprising:
      a data line for inputting data;
      a first thin film transistor and a second thin film transistor, a gate of the second thin film transistor connected to a drain of the first thin film transistor;
      a second capacitor connected the gate and a drain of the second thin film transistor;
      an organic light-emitting diode connected to the drain of the second thin film transistor; and
      a third capacitor connected to two terminals of the organic light-emitting diode, wherein a scan signal is inputted to a gate of the first thin film transistor; and
   a sensing circuit for sensing a micro current and voltage and connected to the pixel circuit, comprising:
      an amplifier having a first input terminal, a second input terminal, and an output terminal;
      a first capacitor connected between the first input terminal and the output terminal of the amplifier;
      a first switch connected to two terminals of the first capacitor in parallel;
      a second switch connected between the first input terminal of the amplifier and the pixel circuit;

a third switch connected between the second input terminal of the amplifier and the pixel circuit;

a fourth switch connected between the second input terminal of the amplifier and a constant voltage source;

a correlated double sampling (CDS) circuit connected to the output terminal of the amplifier; and an analog-to-digital converter (ADC) connected to the correlated double sampling circuit.

10. The OLED display device of claim 9, wherein when the second switch the fourth switch and are turned on and the third switch is turned off, the amplifier is utilized as an integrator.

11. The OLED display device of claim 10, wherein the integrator performs an integration operation to a current and clamps a voltage of the second thin film transistor via an input voltage of the second input terminal to generate an output voltage to the correlated double sampling circuit.

12. The OLED display device of claim 9, wherein when the first switch and the third switch are turned on and the second switch is turned off, the amplifier is utilized as a buffer.

13. The OLED display device of claim 12, wherein the buffer clamps a voltage of the second thin film transistor via an input voltage of the second input terminal to generate an output voltage to the correlated double sampling circuit.

14. The OLED display device of claim 9, wherein the correlated double sampling circuit is utilized for storing a value of a voltage outputted by the amplifier and performing a logical operation to generate a voltage value.

15. The OLED display device of claim 9, wherein the analog-to-digital converter is utilized for digitizing a voltage value outputted by the correlated double sampling circuit and then outputting a digitized value.

* * * * *